United States Patent [19]

Kellam et al.

[11] Patent Number: 5,702,868
[45] Date of Patent: Dec. 30, 1997

[54] HIGH RESOLUTION MASK PROGRAMMABLE VIA SELECTED BY LOW RESOLUTION PHOTOMASKING

[75] Inventors: Mark D. Kellam; Gershon Kedem, both of Chapel Hill, N.C. 27514

[73] Assignee: Astarix Inc.

[21] Appl. No.: 437,222

[22] Filed: May 8, 1995

Related U.S. Application Data

[63] Continuation of Ser. No. 46,529, Apr. 13, 1993, abandoned.

[51] Int. Cl.$^6$ .................................................. G03F 7/20
[52] U.S. Cl. ............................ 430/312; 430/394; 430/396
[58] Field of Search ................................. 430/312, 313, 430/317, 323, 325, 326, 330, 394, 396

[56] References Cited

U.S. PATENT DOCUMENTS 5,134,058  7/1992  Han .................................. 430/327

FOREIGN PATENT DOCUMENTS 31522  1/1991  Japan .................................. 430/394

OTHER PUBLICATIONS

Research Disclosure 25247, Apr. 1985.

*Primary Examiner*—Kathleen Duda
*Attorney, Agent, or Firm*—Allan Jacobson

[57] ABSTRACT

A photoresist (18) is exposed through a design-independent high resolution reticle (20), producing a high resolution image of exposed resist (18A). Photoresist (18) is exposed for the second time through a design-specific low-resolution reticle (24), exposing selected portions (18D) of previously unexposed resist. The remaining portions (18B) of previously unexposed resist form a design-dependent high resolution image. After development of photoresist (18), its unexposed portions (18B) are removed, producing openings (26) in photoresist (18), that can be transferred to underlying material (36), for example by etching openings in that underlying material (36), thereby transferring the design-dependent high-resolution image to it. Since the design-independent high resolution reticle (20) can be prefabricated ahead of time and used to produce many designs with different functions, the above double-exposure method is suitable for fabricating design-specific high resolution features, e.g., contacts (vias) between conducting layers, within time and at the approximate cost required to fabricate and process a low resolution image. Several variants of the basic method are possible.

4 Claims, 6 Drawing Sheets

HIGH RESOLUTION MASK PROGRAMMABLE VIA SELECTED BY LOW RESOLUTION PHOTOMASKING

This is a continuation of application Ser. No. 046,529, filed on Apr. 13, 1993, now abandoned.

FIELD OF THE INVENTION

This invention relates to the field of fabrication of integrated circuits and more specifically to a method for fabricating a patterned thin film layer.

BACKGROUND OF THE INVENTION

Integrated circuits (ICs) are increasingly being used in a large variety of products. In particular, a type of IC called an Application Specific Integrated Circuit (ASIC), designed to perform special-purpose logical or algorithmic functions, has received wide acceptance in the semiconductor industry. However, there are barriers which could hinder the further acceptance of the use of ASICs. Typically, the developmental costs associated with ASIC manufacturing are high because an ASIC is custom designed and manufactured for a single user. For those products which do not have a high potential volume of sale, it may not be economically feasible to design ASICs because the high developmental costs are shared by only a small number of integrated circuits. Furthermore, the turn-around time for designing and manufacturing ASICs is long because custom tools, such as reticles, need to be built. As a result, there is a need for a process that can reduce the developmental colts and shorten the turn-around time of ASIC manufacturing.

The developmental costs associated with producing an ASIC are derived from several sources, including the investment in capital equipment required to manufacture the integrated circuit, the engineering efforts required to design and ascertain the correctness of a new ASIC, the cost of design-specific masks or reticles needed to produce the circuit, and the design-specific set-up costs incurred during the fabrication. For products that achieve large sales volumes, the developmental costs of the ASIC production may be spread across the many units produced. Furthermore, the variable cost is typically low because semiconductor production is oriented toward batch manufacturing (i.e., large numbers of ICs are processed simultaneously) where the fabrication costs of one IC and 1000 ICs are roughly identical. Thus, for sufficiently large volume productions, the low variable costs combined with the small distributed developmental costs lead to the total cost of an ASIC which is lower than the cost of manufacturing the equivalent circuit by combining a larger number of standard, general-purpose electronic sub-units. This makes the ASIC very competitive with alternative implementation strategies.

The most expensive and technically sophisticated form of ASICs are the full-custom designs. The production of ASICs begins with a detailed design of transistor switches and conductive interconnects that will be fabricated. These electronic devices are constructed on a semiconductor substrate by using multiple thin film depositions followed by photolithographic patterning and etching. While the full-custom design method enables the user to achieve the highest circuit density and performance by efficiently using all the available area on the IC, the developmental costs associated with full custom design use are very high. First, the costs of design, layout, and verification of the IC are quite high. In addition, the ASIC producer must pay for all of the photo masks (reticles) used to fabricate the IC. These reticles are typically fabricated using an electron-beam lithography system to pattern a thin chromium film on a quartz or glass substrate, and are rather expensive. Typically, a full-custom CMOS implementation of a desired function requires between 15 and 18 of these reticles for it's fabrication. Furthermore, the semiconductor foundries charge their customers, including the ASIC producers, set-up costs and capital depreciation for the fabrication equipments. These developmental costs are passed along by the ASIC producers to the ASIC end users and are often referred to as Non-Recurring Engineering (NRE) expenses.

There are two common approaches that reduce the developmental costs associated with full-custom ASIC production: the "gate array" and the "standard cell" design styles. The standard cell approach to ASIC production is used to reduce the NRE expenses associated with the design and layout of a full-custom IC. Carefully made designs of commonly used logical function blocks are stored in a library, from which they can be retrieved by an IC designer who interconnects them so as to provide the desired function.

Gate array technology involves the fabrication of a large number of base wafers containing identical integrated circuit elements (gates) up to a lower level of conductive interconnect. The ASIC designer "customizes" the gate array by specifying additional the conductive wiring patterns used to interconnect the pre-fabricated gates. The developmental costs of the reticles and set-up charges associated with the pre-fabrication of the gates are shared among many different users, thereby reducing the NRE expense that each must incur. The number of reticles specific to a particular project is limited to those required to define from one to three levels of discretionary interconnect and the locations of the contacts ("via holes" or "vias") between the different levels of conductive wiring. Each discretionary interconnect level requires two high-resolution reticles, one for patterning the metal wires and one for patterning of via holes in the dielectric thin film underlying these wires. Both the standard cell and gate array technologies make extensive use of Computer Aided Design (CAD) software to automatically place the functional blocks and route the interconnect wiring defining the overall functionality of the ASIC.

Procedures have been developed to lower NRE costs by reducing the number of processing steps required to accomplish the discretionary part of the process (i.e., the part of the process which varies from one ASIC design to another). One method of programming involves patterning of a single top level of discretionary wiring using a single high resolution reticle, one lithographic patterning and one reactive ion etch (RIE) process. Mother method uses a discretionary via reticle followed by a non-discretionary metal reticle to provide the programming function. While these methods reduce NRE expenses with respect to the traditional gate array, they suffer from producing lower density usable circuitry because of the area taken by the programming wires, and all require at least one application-specific high resolution reticle to be made before the ICs can be programmed.

An alternative approach to NRE expense reduction has been made possible by the introduction of Field Programmable Gate Arrays (FPGAs). FPGAs contain logical cells, each of which can perform a number of different functions, and a reconfigurable interconnect grid. The cells are programmable, i.e., the particular function performed by each cell can be set after the FPGA is manufactured. The interconnect grid is programmable as well; it can be rearranged to connect the programmed cells in an appropriate manner so that the FPGA performs the desired function.

One method of programming the interconnect network in a FPGA is to use pass-transistors as switches transferring signals between the various interconnect lines. These transistors are connected to memory cells whose contents decide whether each transistor acts as an open or a closed switch. A designer programs the FPGA by setting the values of memory cells and can change the function of the FPGA by entering new values into that memory.

This method has the advantage of being reprogrammable; however, the pass-transistors introduce considerable series resistance into the interconnect wires and severely limit the speed at which such ICs can operate correctly.

Another technology in FPGA involves the use of anti-fuses, which are one-time programmable switches. Each anti-fuse is nominally unconnected but can form a permanent conductive link after the application of a programming voltage across that anti-fuse. The anti-fuses exhibit somewhat lower series resistance than the pass-transistors, but the resistance-limited performance still falls well below that available from the metallic interconnects used in traditional gate array ICs. Both the pass-transistors and, to a somewhat lesser degree, anti-fuse technology suffer a considerable density penalty because of the area required to fabricate the actual switches and because of the area required by the control circuitry that programs the switches.

Although FPGA require very little or no setup cost and can be customized on the user's workbench in any quantity, they suffer from slow volume programming, low density, comparatively poor performance, very large unit cost, and limited design flexibility. Thus, if an electronic system has to be manufactured in large quantities, its FGPA implementation is considerably more expensive than the gate array implementation. On the other hand, FPGA are more economical to use for low-volume products, and their use considerably reduces the time between completing a design and delivering a product to the market.

It is clear that for many applications, a gate array technology that had reduced NRE costs and the benefit of inexpensive volume production costs would have advantages over all of the previously mentioned technologies.

SUMMARY OF THE INVENTION

Broadly stated, the present invention is a method for fabricating a plurality of high resolution images in a radiation sensitive material. The method comprises the step of exposing a first set of pre-determined locations on the radiation sensitive material by transmitting a plurality of spaced apart high resolution radiation patterns to the radiation sensitive material. The method also comprises exposing a second set of pre-determined locations on the radiation sensitive material by transmitting a plurality of low resolution radiation patterns to the radiation sensitive material. At least one of the plurality of low resolution radiation patterns should cover at least one of the plurality of high resolution radiation patterns. The double exposure allows the selection of the high resolution radiation images using the low resolution radiation patterns. The high resolution image is developed by removing those areas of the radiation sensitive material which are defined by the overlap of the high and low resolution radiation patterns.

The main advantage in using this invention is that the high resolution patterns created by the process can be selectively placed in such a way that the interconnects on a substrate can be "customized" without incurring the costs and delays associated with the production of a high resolution mask or reticle. This can be accomplished without losing the high density and performance associated with the high resolution patterning.

It is an object of the present invention to provide a new method for fabricating integrated circuits.

It is another object of the present invention to provide a low cost method for fabricating integrated circuits.

It is a further object of the present invention to provide a method for fabricating integrated circuits which can reduce turn-around time between development of a prototype and production of the integrated circuit in its final, developed form.

It is yet another object of the present invention to reduce the number of application-specific high resolution reticles used to fabricate integrated circuits.

Other objects, advantages, and features of the present invention will become apparent to those skilled in the art from the following specification when taken in conjunction with the accompanying drawings.

DETAILED DESCRIPTION OF THE INVENTION

The present invention can be used for fabricating a layer of thin patterned material. The invention is illustrated by the example of fabricating a via structure using the present inventive method.

Vias are structures, well known in the art of semiconductor manufacturing, for connecting two conducting layers. Vias are made as "holes" formed in a dielectric material, said dielectric used to physically and electrically separate two metal layers. The via holes in that dielectric material allow the two metal layers to come into physical contact with each other and thus create an electrical connection between the metal layer deposited immediately under the dielectric and the metal layer deposited immediately above the dielectric.

Figure 1:
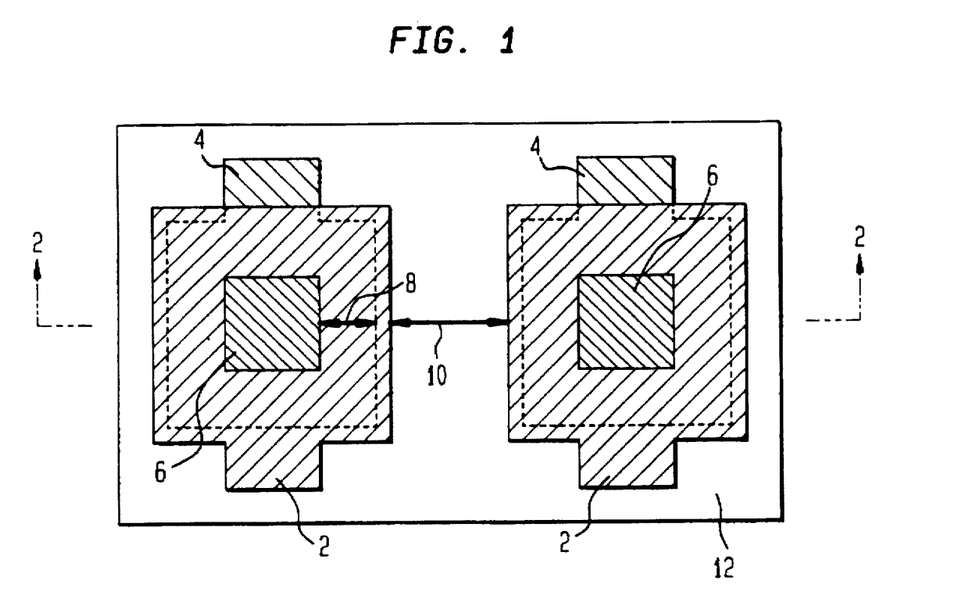
FIG. 1 is a drawing showing a conventional interconductor via structure commonly found on most modern integrated circuits.
Figure 2:
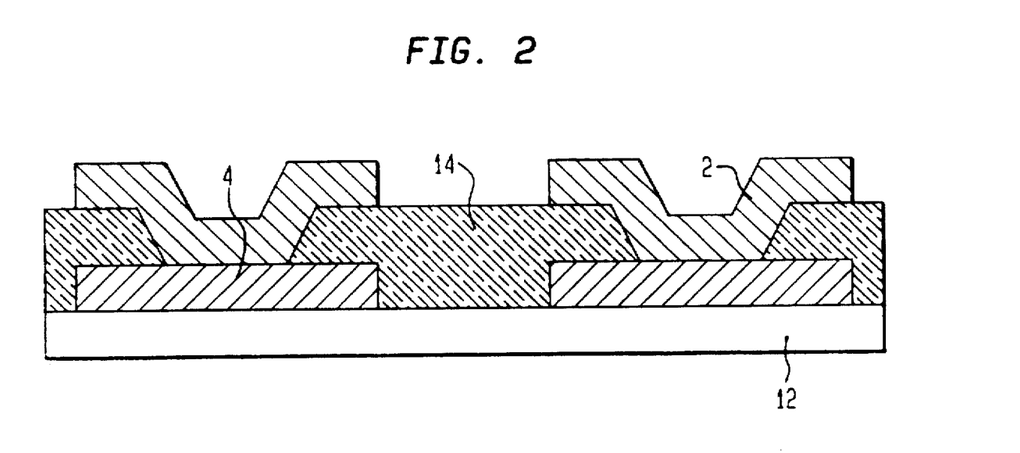
FIG. 2 is a cross section drawing of the structure of FIG. 1.

FIG. 1 and FIG. 2 illustrate the traditional interconductor via structure commonly found on most modern integrated circuits. FIG. 1 shows a top view of two such vias located near each other. Each of the via interconnect structures is defined by three patterns: a lower conductor pattern 4, an upper conductor pattern 2, and a via pattern 6. FIG. 2 shows a cross-section of the two vias depicted in FIG. 1. It can be seen in FIG. 2 that, in locations outside the via pattern 6, the upper and lower conductors are electrically and physically separated by a thin film of the dielectric material 14 such as silicon dioxide or polyimide. The via pattern 6 is used to selectively remove this dielectric material 14 thereby enabling a physical and electrical connection between the lower surface of the upper conductor 2 and the upper surface of the lower conductor 4. It is clear that such a connection is made only in the regions where the three patterns 2, 4, and 6 all overlap each other. Usually, the patterns 2, 4, and 6 are also restricted so that the via pattern 6 is fully surrounded by both the upper and lower conductor patterns 2, and 4. A via structure subject to that restriction is known as a "nested" via. The reasons for having such a restriction are as follows. The substrate 12 shown in FIG. 1 and FIG. 2 usually contains numerous electrical switching devices fabricated near or on the substrate's surface. The substrate and switching devices should be connected to the conducting layers 2 and 4 only in designated points. These devices could be damaged by the etching process used to remove the dielectric material 14 if they were exposed during the etch. The etching process is normally designed so that it will not remove the conductor material. Thus, a full-overlap of the lower conductor pattern 4 around the via pattern 6 will insure that the substrate is fully protected from the dielectric etch process. A sufficient extension 8 of the lower conductor pattern 4 around the via pattern 6 must be provided so that even under the worst-case misalignment of the patterns, and under the worst-case variation of the pattern sizes, the via region is completely contained within the region covered by the lower conductor.

For the purposes of this disclosure, the terms high resolution and low resolution are defined in a relative way. In general, if a plurality of densely placed high resolution patterns are repeated on a substrate, it is possible to define a minimum "pitch" for the pattern. This pitch is defined as the sum of the smallest feature size, and the smallest separation between two features. In many semiconductor applications, the feature size and feature separation are approximately equal, leading to a pattern pitch that is approximately twice as large as the smallest feature size, or the pattern resolution. In order to be useful in selecting from a set of high resolution patterns, a low resolution pattern must have a feature size or resolution that is approximately equal to or larger than the pitch of the corresponding high resolution pattern. In the case of vias between levels of metal interconnect, the invention leads to even greater advantage, because in most modern integrated circuit processes, the minimum distance between adjacent via structures is much larger than the size of the via hole. For instance, while via holes in a 1.0 micrometer very-large-scale integration (VLSI) process are usually squares with a 1.0 micrometer side dimension, the average distance between vias is much larger than 1.0 micrometer. As shown in FIG. 1, the distance between vias is determined by three factors: the size of the via 6, the size of the metal extension 8 surrounding the via, and the minimum distance 10 between two adjacent metal patterns. The separation between upper metal patterns in a 1.0 micrometer VLSI process is typically 1.5 to 2.0 micrometers. A typical size for the metal extension 8 is around 1.0 micrometers. The minimum distance between features in a repetitive pattern is known as the "pitch." The via structure pitch can thus be computed by the formula:

Via Pitch=

Via hole size+2×Metal extension+Metal separation

The above formula is evaluated for both metal layers independently, and the larger of the two resulting values determines the actual via pitch.

Using the structure sizes discussed above, the via pitch for a typical 1.0 micrometer process is computed to be about 5.0 micrometers. The current invention uses the difference between the via pitch and the via hole size to eliminate the need for an expensive function-specific high resolution reticle for use in IC fabrication.

Figure 3A:
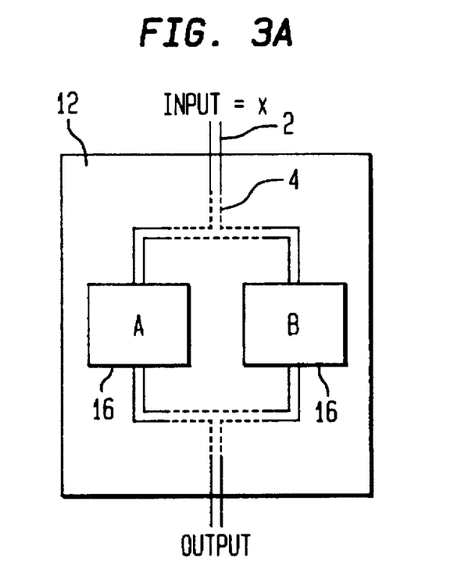
FIGS. 3A, 3B, and 3C are drawings showing methods for programming integrated circuit function using interconductor vias in accordance with the present invention.
Figure 3B:
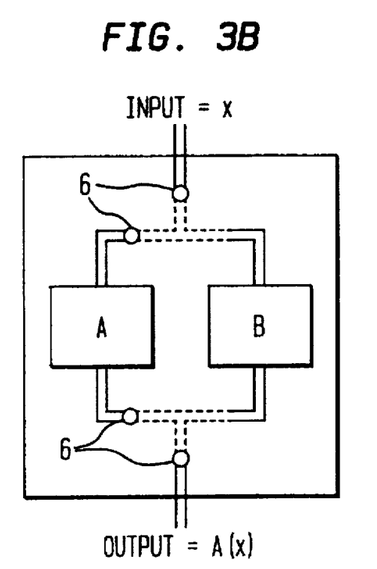
Figure 3C:
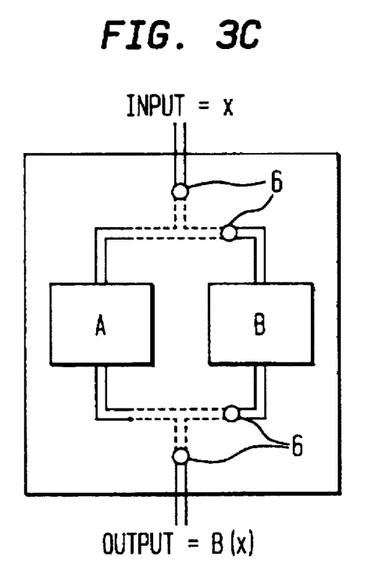

The functionality of an integrated circuit may be "hardware-programmed" by using selectively placed vias to make electrical connections between metal lines. FIG. 3A illustrates this method of hardware-programming. The IC is composed of a substrate 12 upon which two circuit elements A and B are fabricated. Circuit elements A and B can perform different functions on an electrical input signal, labeled as x, and provide the output signals A(x) and B(x), respectively. Two separate layers of conductive interconnect are also fabricated on the substrate and can be used for communication of electrical signals between circuit elements and for external interface. The two layers of wiring are separated by an insulating dielectric film that allows a wire on the upper layer of conductors 2 to cross over a wire on the lower layer of conductors 4 without physical or electrical contact. If electrical connection between the layers is desired, it can be made by creating a "hole" in the dielectric at a location where the upper conductor crosses the lower one. This hole is made before the fabrication of the upper layer of conductors. When the upper conductive wire is fabricated, the material will enter the hole and make physical and electrical contact with the surface of the lower conductor exposed inside the via hole. FIG. 3B and FIG. 3C show that the selective placement of the vias can be used to choose between the two possible output functions A(x) and B(x) that the "programmable" chip is capable of producing.

In the prior art, the placement choices of the vias are defined by making a high resolution mask (reticle) that contains a pattern representing the via holes desired on the IC. Such reticles are made by electron-beam (e-beam) patterning of a chrome film on a glass or quartz substrate. The image on the reticle is typically reduced to one-fifth of its size by the "camera" used to expose the photoresist on the substrate, so that manufacturing a 1.0 micrometer IC feature dimension requires a chrome pattern feature size of 5.0 micrometers. Reticles of a quality required for use in modern VLSI processing typically cost about $2000 each and require several days to make. Quicker turnaround is technically feasible, but large premiums are charged by the reticle manufacturer for faster completion of the job.

Recent improvements in laser scanning photoplotters for the printed circuit board industry have brought the technology for making mylar film patterns much closer to the VLSI dimensional realm. Patterned mylar films with minimum feature sizes of 1 mil (25 microns) and multiple pattern registration accuracy of ⅛ mil (4 microns) are available with overnight delivery for a price of about $50 each. One aspect of the current invention is that the vias that "program" a chip may be selected without a need for an expensive high resolution reticle having a function-specific pattern. The programming can be accomplished by forming a high resolution "latent" image of all possible via locations, followed by a low-resolution secondary selection of the vias to be made. The high-resolution "latent" image is made with a general-purpose high resolution reticle that can be re-used for a number of different ICs, while the second exposure for via selection can use the inexpensive mylar film technology. This method significantly reduces the mask manufacturing time and the cost associated with a specific interconnect topology.

Figure 4:
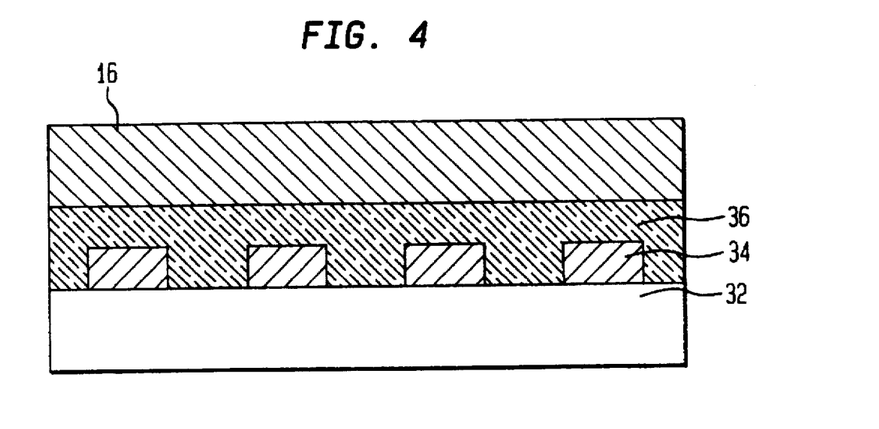
FIG. 4 is a drawing showing the deposition of a photoresist layer on a semiconductor structure in accordance with the present invention.

FIG. 4 is a drawing showing the preparation of the substrate to be used in the present invention. The process begins with a substrate 32, on which metal wires 34 are fabricated and covered with the interconductor dielectric 36 that, in turn, is coated with a photoresist material 18 (FIG. 4). For simplicity, no electronic structures are shown in the substrate, but it is understood that this substrate may be comprised of a semiconductor wafer, and it may contain electronic devices such as, e.g., transistors and interconnect wiring. The photoresist may be for example a negative acting or a chemically reversible positive acting photoresist. For illustration of the process, a negative acting photoresist will be described. Negative photoresists work by photochemically cross-linking a photosensitive polymer so that photoresist areas that are exposed to light or other appropriate radiation, are resistant to removal by a liquid developer.

In the present invention, photoresist is broadly defined as a material that is chemically or structurally modified by exposure to a source of transmittable energy. This energy may be delivered by photons that span the range of energies from X-rays to the infrared, or the energy for the modification may be transmitted to the material by means of energetic massive particles including electrons or ions. The photoresist is exposed to a patterned source of energy such that the pattern is "stored" as a latent image comprising regions of modified and unmodified material. If the resist is being used to transfer this pattern into another material, this latent image is usually "developed" by removal of either the modified regions of the resist or the unmodified regions of the resist. The underlying material is then etched in the regions that are not protected by the remaining resist. The most simple photoresist systems are based on the radiation enhanced crosslinking or scissioning of bonds in an organic matrix. The resist is developed by immersion in a liquid developer that removes either the uncrosslinked resist or the scissioned resist regions. More complex resist-development systems have been used; including some that avoid the use of liquid developing agents. One example of such a "dry" development process involves "sililation" of selected areas of the resist following the exposure. Sililation is accomplished by diffusing a silicon containing substance into the resist surface where the diffusing coefficient and reaction with the organic matrix depend on whether the region has been exposed or not. Both positive and negative tone sililation processes have been demonstrated, using exposure to an oxygen containing plasma or reactive ion etch as the "development" step. The silicon containing regions are resistant to etching in such a treatment, thus allowing selective removal of material from the regions that do not contain the silicon.

Figure 5:
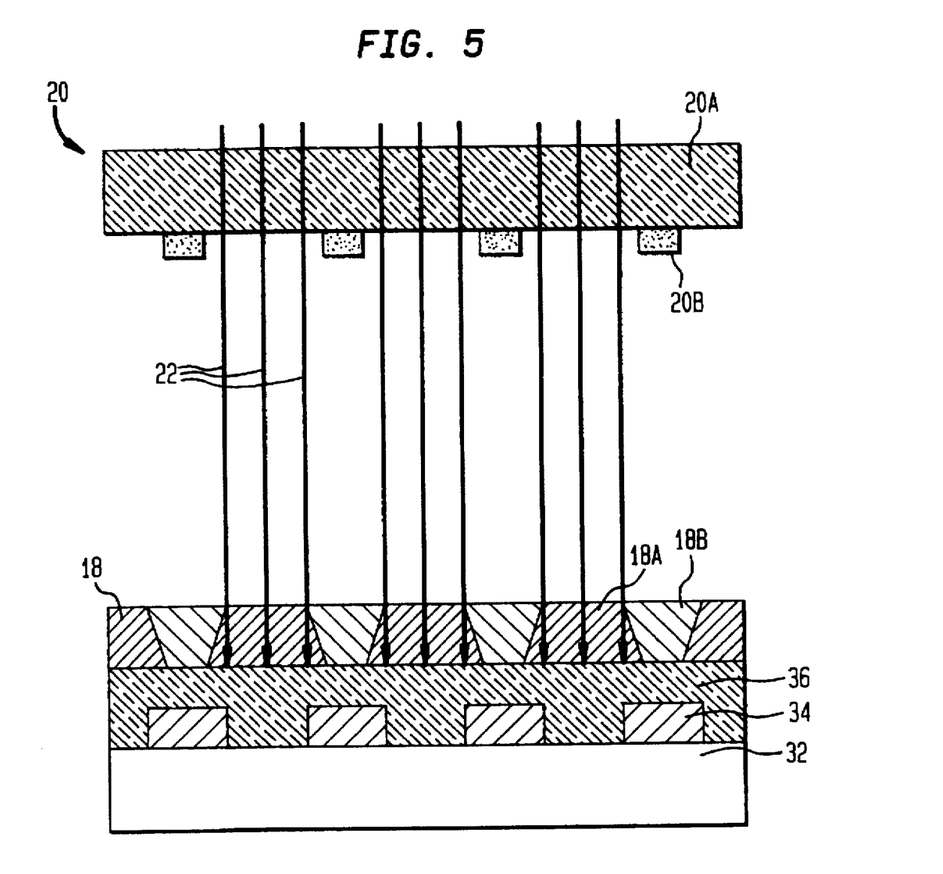
FIG. 5 is a drawing showing the step of transmitting high resolution optical patterns in accordance with the present invention.

As illustrated in FIG. 5, the photoresist is then exposed to a projected image 22, using a high resolution reticle 20 that contains the images of all potential programming vias. The high resolution reticle is composed of a transparent substrate 20A that has a patterned thin film of an opaque material 20B on one surface. Typically, the substrate material 20A is quartz or a low expansion glass, and the opaque film 20B is chromium. The chromium is patterned by exposure of a photoresist material in an electron-beam lithography tool, followed by subtractive etching of the chromium. While the feature sizes on the reticle 20 are, for simplicity of presentation, shown in FIG. 5 as being of exactly the same size as their projections onto the substrate, it should be noted that, in the contemporary VLSI technology, the size of the features printed on the reticle is generally larger by a factor of 4 to 10 than the desired features to be made on the substrate surface. The reduction in image size is accomplished by the optical system of a reduction step-and-repeat camera, that aligns the reticle pattern to previously defined patterns on the substrate and then exposes the substrate with a de-magnified image of the reticle pattern. FIG. 5 shows the image pattern exposed in the photoresist 18A. The unexposed areas 18B are left essentially un-modified by this first exposure, and they retain their photosensitivity. A similar result may be obtained by exposure of certain positive acting photoresists followed by a thermochemical treatment in an amine vapor. The vapor acts to cross-link the exposed regions while leaving the unexposed regions unmodified. Photoresists are also available that contain compounds that release an amine during a bake cycle. Following the amine bake cycle the pattern of crosslinked resist is the same for the positive resist as for the negative resist.

In order to use the present invention to "program" an integrated circuit, the patterns on the high resolution reticle might be that of an array of interconductor vias. The array should contain all possible via locations on the integrated circuit so that a latent via image is formed in every potential via location. If the photoresist was developed after the exposure of the high resolution reticle, and the processing of the substrate completed, all potential vias would be made into electrical contacts. In order to restrict the via interconnections to a subset of vias (actual vias) required to "program" a specific functionality, some of the latent via images are removed by exposure to a second reticle pattern as shown in FIG. 6.

Figure 6:
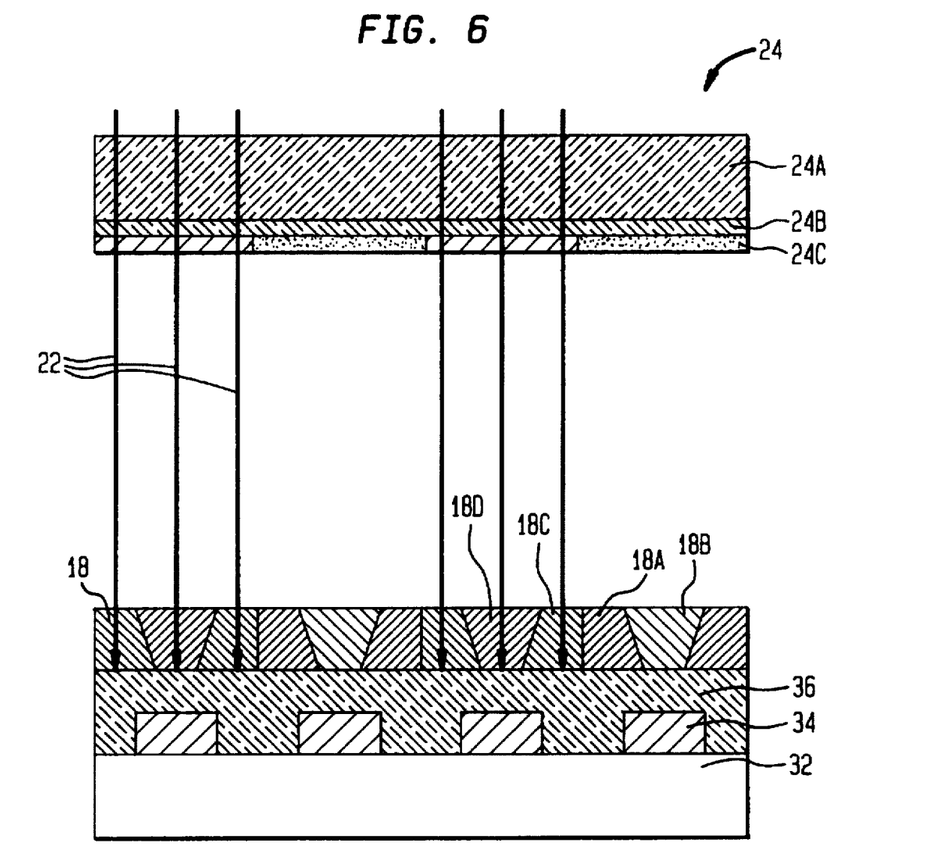
FIG. 6 is a drawing showing the step of transmitting low resolution optical patterns in accordance with the present invention.

FIG. 6 illustrates the second exposure, which is performed in a step and repeat reduction camera using a low resolution reticle 24. A low cost photographic film 24C is made that contains a pattern that corresponds only to the actual vias. The film may be bonded or laminated to the surface of a transparent substrate 24A by a transparent adhesive 24B. This low resolution reticle is aligned to the previously fabricated IC features and the photoresist is given a second exposure to light or other appropriate radiation 22 passing through the low resolution reticle. While the features on the reticle are much larger than the "latent" image in photoresist, the separation of the "latent" images is sufficient to prevent the exposure of a given via by the light intended to expose a neighboring via. Re-exposure of previously cross-linked photoresist 18C does not reduce its resistance to the developer; however, exposure of the regions 18D that were not exposed previously will render them insoluble as well. Latent via images that are not exposed to light during this second exposure 18A are unaffected and will retain the size and position defined by the photoresist 18B left unexposed by the high resolution reticle.

Figure 7:
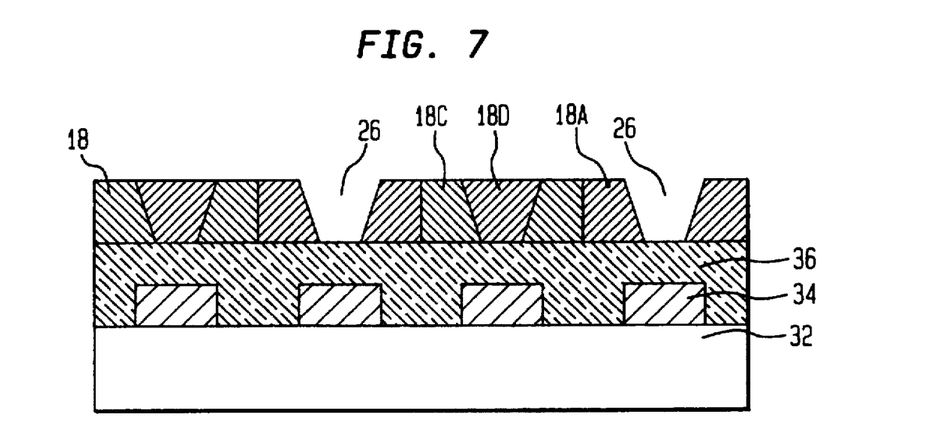
FIG. 7 is a drawing showing the removal of portions of photoresist in accordance with the present invention.
Figure 8:
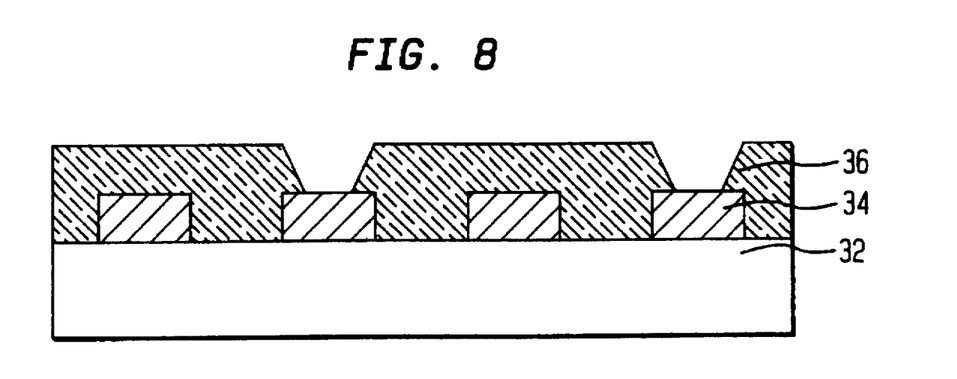
FIG. 8 is a drawing showing the etch transfer of resist pattern into the dielectric in accordance with the present invention.
Figure 9:
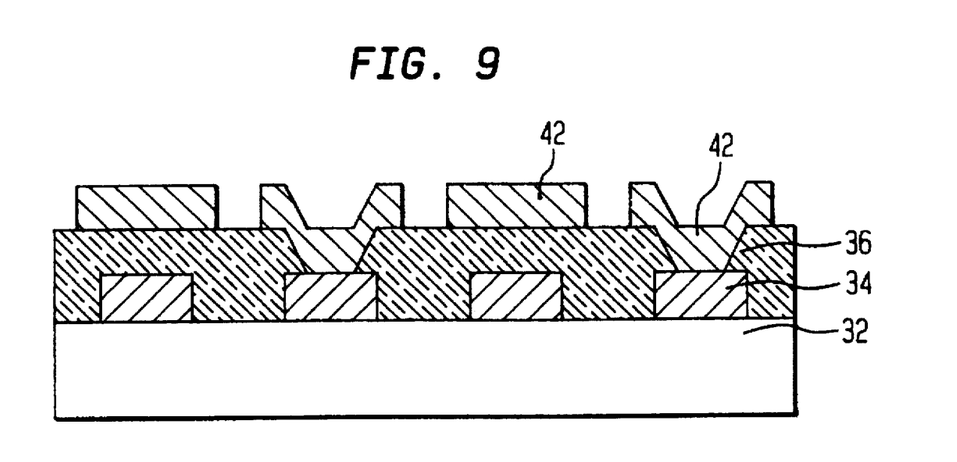
FIG. 9 is a drawing showing the deposition and patterning of upper conductors in accordance with the present invention.

Following the second exposure, the photoresist is immersed in a liquid developer that dissolves the photoresist 18B in FIG. 5 that did not receive any exposure to light and uncovers the dielectric surface in the holes 26 in the photoresist (FIG. 7). The resulting photoresist pattern has the same structure as if it had been patterned with a high resolution reticle containing only the pattern of the functionality specific programming vias. FIG. 8 illustrates the transfer of the photoresist pattern into the interconductor dielectric material 36. This transfer is accomplished by exposing the surface of the dielectric, partially covered by photoresist as in FIG. 7, to an etchant that will remove the dielectric in the regions that are not protected by the photoresist. After the etch has exposed the surface of the lower conductor, the photoresist material is removed. FIG. 9 shows a cross-section of the structure after deposition and patterning of upper-level conductors 42. High resolution vias that were selected during the low resolution masking step allow the contact of the upper and lower conductor levels, while potential vias that were removed by the low resolution exposure remain unconnected. The advantage of using the double exposure process is that the high costs and time required to produce a function specific high resolution reticle can be avoided. One high resolution reticle may be shared by many different circuit designs. Each design requires only a low resolution function-specific reticle to determine the specific locations of vias between different levels of conducting wires.

Figure 10:
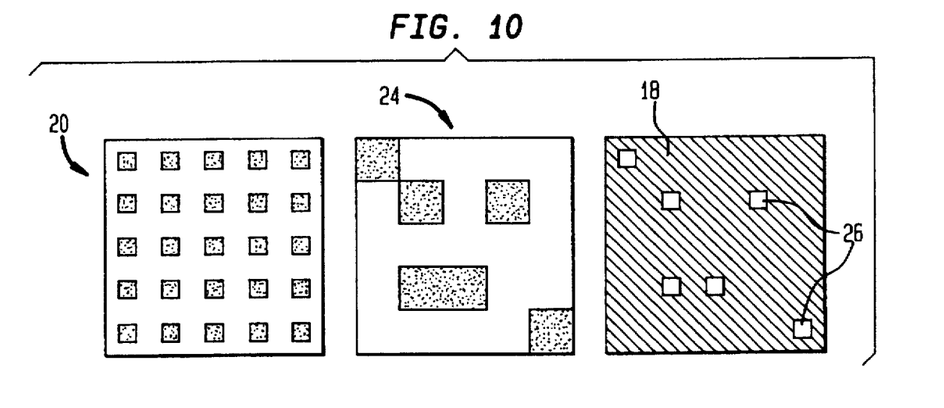
FIG. 10 is a drawing showing the relationship of the high and the low resolution patterns and the final negative resist pattern in accordance with the present invention.

FIG. 10 shows the relationships among the high and low resolution reticles and the final pattern in a negative photoresist, such as photoresist 18 in FIGS. 4–7 on the wafer. The final photoresist pattern may be described by set operations on the two reticle patterns. If the opaque patterns of the high and low resolution reticles are designated as sets "A" and "B," respectively, then the regions 26 of the photoresist that will be removed by the developer will be defined as a result of the set intersection A∩B. This figure also serves to illustrate the resolution limits placed on the low resolution reticle by the high resolution reticle. In order to be useful in the via programming example application described above, the low resolution reticle features must overlap the features of the high resolution reticle that are intended to remain in the substrate photoresist film. The low resolution feature must not overlap the next nearest feature, however, so the optimal position for the edge of the low resolution feature is halfway between two high resolution features. Thus, the smallest feature required on the low resolution reticle is equal to the "pitch" of the features on the high resolution reticle. The pitch is defined as the sum of the smallest feature size and the separation between adjacent features. In general, the smallest separation of features on any given high resolution reticle is approximately equal to the feature size, leading to the conclusion that the low resolution reticle needs to have only half the resolution of the high resolution reticle. As discussed in a previous section, a typical separation between high resolution vias is much larger than twice the size of the via holes, further reducing the resolution requirements placed on the low resolution reticle.

Figure 11:
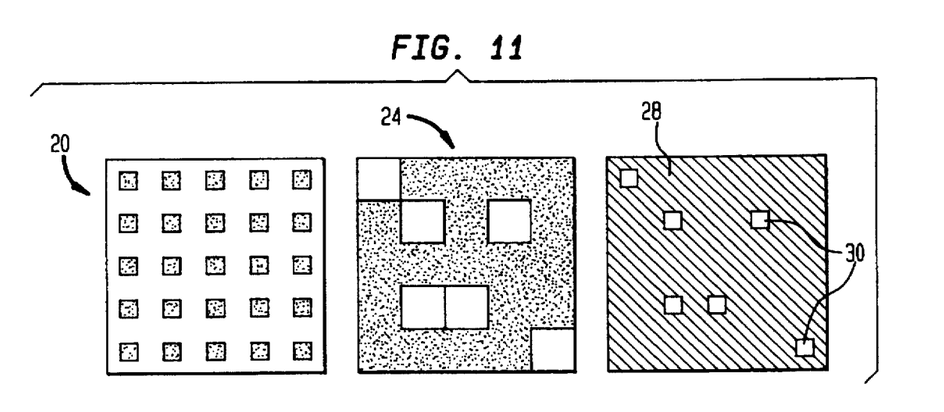
FIG. 11 is a drawing showing the relationship of the high and the low resolution patterns and the final positive resist pattern in accordance with the present invention.

FIG. 11 shows the relationships in the horizontal plane of the high and low resolution reticles and the final pattern in a reversible positive photoresist 28 on the wafer. The final photoresist pattern may be described by set operations on the two reticle patterns. If the opaque patterns of the high and low resolution reticles are designated as "A" and "B," respectively, then the regions 30 of the photoresist that will be removed by the developer will be defined by the set difference A−B. From a comparison of FIG. 11 and FIG. 10 it is clear the polarity of the second mask used with a negative resist is opposite that of a second mask used with a reversible positive resist. The initial mask polarity for the two processes are the same since the exposed areas are directly crosslinked by exposure in the negative resist, and the exposed areas are chemically crosslinked during the amine vapor treatment needed to reverse the positive resist. The second mask polarity used on negative resist can be used with reversible positive resist if a second amine vapor treatment is applied following the second mask exposure. This second treatment will chemically crosslink those vias that have been exposed to the light transmitted through the mask, effectively preventing connections in those locations. A flood exposure of the entire wafer is required in this case to render the vias that have not been exposed in either masking operation soluble in a positive developer. After development the process is completed as described in a previous section.

A wide range of possible process sequences can be used to select high resolution patterns with a low resolution exposure. The invention can be used with both positive and negative acting resists, and with many combinations of mask polarity and exposure order. Several factors are common to all of these process sequences. One common factor is that if a light field low resolution pattern is used to select a first set of patterns from the total group defined by the high resolution reticle, then a dark field low resolution reticle can be used to select patterns that are complimentary to that set. A second common factor is that a process that leads to features defined by the removal of resist by development can always be inverted by deposition of a masking material followed by liftoff. This allows the process to be used to define patterns defined by regions of resist that remain after development. Examples of such patterns would include polysilicon gate and metal wiring patterns. Table 1 gives examples of some of the process sequences that allow the selective development of patterns such as contacts or vias, that are defined by the removal of the resist in the defined areas. Table 1 shows that the high and low resolution mask can be light or dark field patterns, and that processes can be designed that use either the high or low resolution pattern as the first exposure.

The embodiment described in the previous sections was based on the use of two masks to achieve the desired result. It should be clear that the invention can also be practiced with a broader range of patterning technologies with similar benefit. For instance, the initial high resolution exposure could be performed using an electron-beam or an x-ray lithography tool. The second exposure could be performed using a direct write laser scanning system. The process is restricted by the requirement that the resist material used must have sensitivity to both the high and low resolution patterning technologies. It should also be noted that in many cases the order of high and low resolution exposures may be reversed.

In the previous descriptions of the invention, the "storage" medium of the "latent image" produced by the first exposure is the resist material itself. It is also possible to transfer this image into a secondary material by standard development and etching techniques, after which the first resist is removed and a second resist is applied to the substrate. The "programming" technique can then be practiced using the pattern overlap between the image developed in the second resist and the previously defined "latent image".

The embodiment of the invention discussed in the previous section is targeted towards its use in fabrication processes with minimum feature sizes of approximately 1.0 micrometer. It is clear that the use of the invention provides a significant cost reduction by using a low resolution reticle, e.g., produced by a laser photoplotting system, to replace a high resolution reticle, e.g., produced by an e-beam lithography tool. The 25 micrometer resolution of modern photoplotters corresponds quite well with the 5 micrometer via pitch encountered in many 1.0 micrometer processes; however, it is clear that until the capabilities of such photoplotting tools are improved, the use of this technology is preferably limited to IC processes of approximately this dimension. The benefit provided by the broad scope of the invention is not limited to these dimensions, however, because of the relationship between reticle resolution and reticle cost. The costs for producing a high resolution via reticle for a 0.5 micrometer process will be significantly higher that the cost of producing an e-beam generated reticle with 2.5 micrometer resolution. Assuming that the pitch of the vias in the 0.5 micrometer process is still five times larger than the via hole size, the use of the double masking process with two e-beam generated reticles still provides economic benefits.

The use of the double masking process of this invention is not limited to fabrication of the traditional interconductor via and has potential benefit to a broad range of mask-programmable applications. One example of such additional use is in the area of fusible link cutting. Several technologies are available for programming IC functionality by cutting fusible links of conductive material. The links are cut in a prototyping mode by exposure to a high power laser cutting tool or by passing a high current through the link. When the prototype version of the IC is ready for volume production, the links are cut by photolithographically opening windows in a photoresist film and exposing the selected links to an etch process that cuts the connections. It is clear that the current invention could dramatically reduce the costs associated with the migration to the mask-programmable version of the IC by elimination of the need for a function specific high resolution reticle.

It is also clear that the invention is not limited to the integrated circuit applications and can be used in any other photolithography-based process where a selection of high-resolution features must be made, provided that the spacing of those features can be covered with a low-resolution mask with overlap and registration sufficient to separate the "selected" features from the "non-selected" ones. It is possible to apply the current invention with any appropriate method of manufacturing, with exposing the low resolution mask, and with any other combination of photoresists used to hold the latent high-resolution image and low-resolution selection image, including multi-layer resists. Thus, the invention is not limited to the use of optical energy as a means for exposure but includes the use of other parts of the radiation spectrum.

It is intended that the present invention not be specifically limited to the embodiments and illustrations contained herein but embraces all such modified forms thereof as come within the scope of the following claims.

TABLE 1

Examples of Process Sequences

| resist type | first exposure | 2nd process | 2nd exposure | 3rd process | 4rth process |
|---|---|---|---|---|---|
| negative | LR-DF | none | HR-LF | none | none |
| negative | LR-LF | none | HR-LF | none | none |

TABLE 1-continued

Examples of Process Sequences

| resist type | first exposure | 2nd process | 2nd exposure | 3rd process | 4rth process |
|---|---|---|---|---|---|
| negative | HR-LF | none | LR-LF | none | none |
| negative | HR-LF | none | LR-DF | none | none |
| positive | HR-LF | amine reversal | LR-LF | none | none |
| positive | HR-LF | amine reversal | LR-DF | none | none |
| positive | LR-LF | amine reversal | HR-DF | none | none |
| positive | LR-DF | amine reversal | HR-DF | none | none |
| positive | LR-LF | amine reversal | HR-LF | amine reversal | flood expose |
| positive | LR-DF | amine reversal | HR-LF | amine reversal | flood expose |

LR: Low Resolution
HR: High Resolution
DF: Dark Field (transparent region on reticle defines via or contact)
LF: Light field (opaque region on reticle defines via or contact)

What is claimed is:

1. A double exposure method for fabricating a selected set of structures on a substrate, said method comprising the steps of:

providing said substrate with a radiation sensitive material disposed on said substrate;

transmitting a first radiation pattern representing a plurality of first substantially identical patterns towards said substrate for exposing first areas of said radiation sensitive material to said first radiation pattern to form a plurality of first substantially identical patterns in said radiation sensitive material;

transmitting a second radiation pattern representing a second plurality of patterns towards said substrate for exposing at least one but not all of said first areas of said radiation sensitive material to said second plurality of patterns to select at least one but not all of said formed plurality of first substantially identical patterns in said radiation sensitive material;

removing portions of said radiation sensitive material in accordance with said first and second radiation patterns; and forming said selected set of structures in said substrate through said removed portions of said radiation sensitive material.

2. A method in accordance with claim 1, wherein said radiation sensitive material comprises a negative acting photoresist material.

3. A method in accordance with claim 1, wherein said first and second radiation is optical radiation.

4. A method in accordance with claim 1, wherein each of said selected set of structures comprises a via.

* * * * *